(12) United States Patent
Duong et al.

(10) Patent No.: US 9,012,322 B2
(45) Date of Patent: Apr. 21, 2015

(54) SELECTIVE ETCHING OF COPPER AND COPPER-BARRIER MATERIALS BY AN AQUEOUS BASE SOLUTION WITH FLUORIDE ADDITION

(71) Applicant: Intermolecular Inc., San Jose, CA (US)

(72) Inventors: Anh Duong, Fremont, CA (US); Errol Todd Ryan, Clifton Park, NY (US)

(73) Assignee: Intermolecular, Inc., San Jose, CA (US)

( * ) Notice: Subject to any disclaimer, the term of this patent is extended or adjusted under 35 U.S.C. 154(b) by 28 days.

(21) Appl. No.: 13/857,696

(22) Filed: Apr. 5, 2013

(65) Prior Publication Data

US 2014/0302671 A1    Oct. 9, 2014

(51) Int. Cl.
| | |
|---|---|
| H01L 21/44 | (2006.01) |
| H01L 21/768 | (2006.01) |
| H01L 21/3213 | (2006.01) |
| C23F 1/34 | (2006.01) |

(52) U.S. Cl.
CPC .... *H01L 21/76841* (2013.01); *H01L 21/32134* (2013.01); *C23F 1/34* (2013.01)

(58) Field of Classification Search
None
See application file for complete search history.

(56) References Cited

U.S. PATENT DOCUMENTS

| | | | |
|---|---|---|---|
| 3,658,610 A * | 4/1972 | Arita et al. | 438/702 |
| 5,419,805 A | 5/1995 | Jolly | |
| 6,200,910 B1 | 3/2001 | O'Brien et al. | |
| 6,638,326 B2 | 10/2003 | Small | |
| 7,741,230 B2 | 6/2010 | Rachmady | |
| 2001/0037995 A1 | 11/2001 | Akatsu | |
| 2004/0080024 A1 | 4/2004 | Datta | |
| 2004/0140291 A1 | 7/2004 | Swanson | |
| 2008/0072926 A1* | 3/2008 | Munakata | 134/2 |
| 2010/0112821 A1* | 5/2010 | Itano et al. | 438/745 |
| 2010/0167514 A1 | 7/2010 | Kirkpatrick | |
| 2010/0295088 A1* | 11/2010 | D'Evelyn et al. | 257/99 |
| 2011/0014793 A1* | 1/2011 | Muramatsu et al. | 438/706 |
| 2013/0048904 A1 | 2/2013 | Adaniya | |

OTHER PUBLICATIONS

SiliconFarEast; Wet Etching Recipes; Feb. 8, 2011; SiliconFarEast; httpwww.siliconfareast.cometch_recipes.htm 2 pages.
Lab Manual Miscellaneous Etchants; ; University of California, Berkeley; Marvell Nanofabrication Laboratory 13 pages.
Yongliang et al.; Selective wet etch of a TaN metal gate with an amorphoussilicon hard mask; Apr. 18, 2010.
Chen et al.; TaTiN midgap fullmetal single gate fabrication using combined chlorinebased plasma and highly selective chemical metal etching for decananometer CMOS technology; ; Science Direct; Unknown.

* cited by examiner

*Primary Examiner* — Charles Garber
*Assistant Examiner* — Abdulfattah Mustapha

(57) ABSTRACT

Wet-etch solutions for conductive metals (e.g., copper) and metal nitrides (e.g., tantalum nitride) can be tuned to differentially etch the conductive metals and metal nitrides while having very little effect on nearby oxides (e.g., silicon dioxide hard mask materials), and etching refractory metals (e.g. tantalum) at an intermediate rate. The solutions are aqueous base solutions (e.g., ammonia-peroxide mixture or TMAH-peroxide mixture) with just enough hydrofluoric acid (HF) added to make the solution's pH about 8-10. Applications include metallization of sub-micron logic structures.

17 Claims, 2 Drawing Sheets

SELECTIVE ETCHING OF COPPER AND COPPER-BARRIER MATERIALS BY AN AQUEOUS BASE SOLUTION WITH FLUORIDE ADDITION

BACKGROUND

Semiconductor devices have dramatically decreased in size in the last few decades. Modern devices include features that are 350 nanometers, 90 nanometers, and 65 nanometers in size and often even smaller.

As device and feature sizes continue to shrink, the metallized lines and vias interconnecting the devices must both shrink and become more densely packed. Consequently, the resistance R of the interconnects and the parasitic capacitance C between neighboring interconnects both increase, increasing interconnect RC delay until it becomes a serious limiting factor in processing speed.

Using copper as the interconnect metal, surrounding the copper with low-dielectric-constant ("low-k") material, or both can reduce the interconnect-related delay. Obstacles to implementation include the tendency of copper to diffuse through dielectrics, form deep energy levels in silicon, and react with silicon to form silicides. All of these can cause device deterioration and failure.

To block copper diffusion, various barrier layers and multi-layer barrier stacks are placed between the copper and nearby materials. Desirable characteristics of a copper-barrier layer include low resistivity, low reactivity with copper, good adhesion to copper and surrounding materials and, where high-aspect ratio features must be conformally coated, good step and bottom coverage to provide uniform thickness over sidewalls and bottoms of trenches as well as on plateaus. The processing parameters (e.g. temperature and precursor composition) must also be compatible with other required processes and not harmful to other materials and structures on the substrate.

Refractory metals and their associated nitrides are popular copper-barrier materials. In some fabrication processes, it is desirable to etch both the copper and the barrier layer in a single processing step, but to etch them at selectably different rates. Chemically basic etch solutions such as APM (ammonia/hydrogen peroxide mixtures) and TMAH (Tetramethylammonium hydroxide) efficiently etch metals such as copper without unacceptably damaging hard-mask materials such as $SiO_2$. However, they are very slow to etch liner and barrier materials such as tantalum nitride. Acid cleans, by contrast, etch both conductive metals and barrier layers quickly but also etch the hard-mask materials quickly. Therefore, a need exists for a range of etchant formulations to selectively etch copper and barrier materials without unacceptable damage to $SiO_2$ hard-masks and other nearby dielectrics.

SUMMARY

This Summary is intended to introduce some aspects of the subject matter, not to limit its scope.

Embodiments of an etch solution for selectively etching a metal (e.g., copper) and a metal nitride (e.g., tantalum nitride) include an aqueous solution of a base with added hydrofluoric acid (HF). In some embodiments, the base is an ammonium-hydroxide mixture ("APM") or tetramethylammonium hydroxide ("TMAH"). The addition of HF results in a solution with a pH between about 8 and about 10; lower than the pH of the base with no additives, but still basic. In one embodiment, the concentration ratios of ammonium hydroxide, hydrogen peroxide, hydrofluoric acid, and water in the solution are about 1:1:1:10.

Embodiments of a method of simultaneously etching a metal and a metal nitride include exposing the metal and the metal nitride to a solution of a base and HF, where the solution has a pH between about 8 and about 10. In some embodiments, the base is an ammonium-hydroxide mixture ("APM") or hydrogen peroxide ($H2O2$) or tetramethylammonium hydroxide ("TMAH"). In some embodiments, the metal and the metal nitride are exposed to the solution for about 60 seconds at a temperature of about 40 C, for about 5 minutes at a temperature of about 60 C, or at selected intermediate times and temperatures. In some embodiments, the concentration ratios of ammonium hydroxide, hydrogen peroxide, hydrofluoric acid, and water in the solution are about 1:1:1:10. Some embodiments of the method include etching the metal less than about 10 times as quickly as the metal nitride is etched. In some embodiments, the metal etched by the solution includes copper and the metal nitride includes tantalum nitride. In some embodiments, the solution etches silicon dioxide at a rate less than about 10 Å/sec at a temperature of about 40 C.

Embodiments of a method for making a semiconductor device include depositing a hard-mask material over a dielectric, forming an opening (e.g., a hole or trench) through the hard-mask and extending into the dielectric, lining the opening with a barrier, filling the opening with a conductor, removing (e.g. by planarization) the conductor and barrier from an area of the substrate outside the opening while leaving at least a portion of the hard-mask over that area, and using a solution of a base and HF to simultaneously etch (1) the barrier to a level below a top surface of the substrate ("recessed barrier level") and (2) the conductor to a level below the recessed barrier level ("recessed conductor level").

In some embodiments of the method, the conductor may include a metal, which may be copper. The barrier may include a metal nitride, which may be tantalum nitride. The solution may have a pH in a range from about 8 to about 10. In some embodiments, the base is an ammonium-hydroxide mixture ("APM") or hydrogen peroxide ($H2O2$) or tetramethylammonium hydroxide ("TMAH"). In some embodiments, the metal and the metal nitride are exposed to the solution for about 60 seconds at a temperature of about 40 C, for about 5 minutes at a temperature of about 60 C, or at selected intermediate times and temperatures. In some embodiments, the concentration ratios of ammonium hydroxide, hydrogen peroxide hydrofluoric acid, and water in the solution are about 1:1:1:10. In some embodiments, a portion of the hard mask remains in place after exposing the substrate to the solution. In some embodiments, the recessed conductor level is less than about 10 times further below the top surface of the substrate than the recessed barrier level.

DETAILED DESCRIPTION OF EXAMPLE EMBODIMENTS

While some concepts will be illustrated by one or more example embodiments, these embodiments are not intended to be limiting. Specific details are set forth in the example embodiments to aid understanding of the presented concepts, but the concepts may be practiced without some or all of these specific details. The manufacture of semiconductor devices typically involves many processes, only a few of which are relevant to this Description. Therefore, this Description refers to some widely-known processes but does not describe them in detail here, and omits many processes that may precede or follow those described here.

Figure 1A:
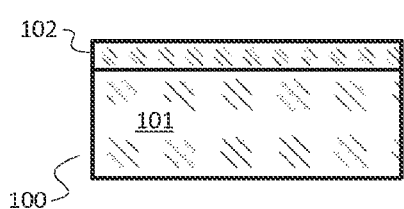
FIGS. 1A-1F are conceptual cross-sections illustrating a process of depositing a hard mask, a barrier, a conductor, and a cap.

FIGS. 1A-1F are cross-sections conceptually illustrating one process of depositing a hard mask, a barrier, a conductor, and a cap. In FIG. 1A, substrate 100 with a dielectric layer 101 is coated with hard mask 102. In practice there may be one or more layers, not shown, underneath dielectric layer 101. In some embodiments, dielectric layer 101 is a low-k or ultra-low-k material. In some embodiments, hard mask 102 is silicon dioxide ($SiO_2$), and may be derived from tetra-ethyl-ortho-silicate (TEOS), which converts to $SiO_2$ by rearrangement and thus involves much less enthalpy and free energy than an oxidation-based conversion.

Figure 1B:
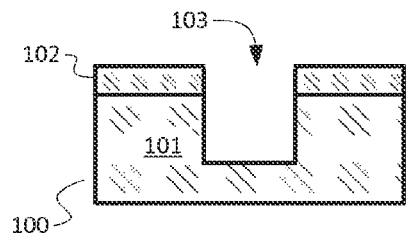

In FIG. 1B, an opening 103 is made through hard mask 102 into dielectric layer 101. In practice, the cross-section of opening 103 may not be perfectly square or rectangular. The opening can be made by a number of different processes including photolithography, other types of chemical etching, laser ablation, particle-beam machining, etc.

Figure 1C:
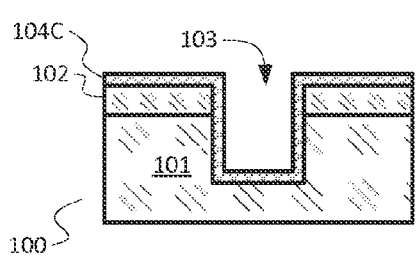

In FIG. 1C, conformal barrier coating 104C is applied to substrate 100. In some embodiments, the barrier coating has more than one layer. For example, there may be a metal nitride layer and a layer of metal (e.g., tantalum nitride and either tantalum, a tantalum-titanium alloy, or ruthenium). In practice, the coating may not be as uniform on the opening bottom, the side walls, and the top surface as shown in this simplified illustration, but this is often the ideal sought for in such a barrier coating.

Figure 1D:
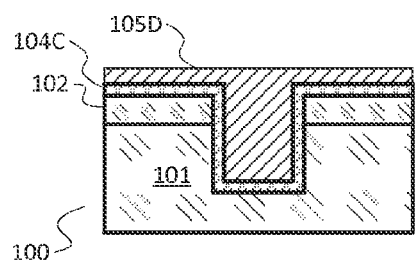

In FIG. 1D, a conductor layer 105D is added. In some embodiments, conductor 105D is a metal, such as copper or one of its alloys. In practice, the top surface may not be perfectly flat as shown.

Figure 1E:
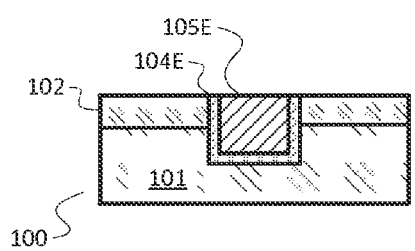

In FIG. 1E, portions of layers 104C and 105D above hard mask 102 have been removed, leaving only the portions 104E of the barrier and 105E of the conductor inside the space initially made by opening 103. This step may be executed by chemical-mechanical planarization (CMP) or planarization by laser or particle beam. In some embodiments, some of hard mask 102 is also removed. In any case where the removal is by planarization, the upper surfaces of remaining hard mask 102, barrier 104E, and conductor 105E are substantially continuous and approximately coplanar.

Figure 1F:
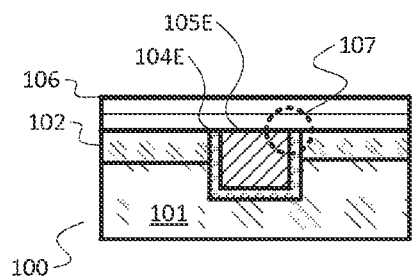

In FIG. 1F, a cap 106 is deposited on the substrate. In some embodiments, cap 106 may be a multilayer stack and may include a second barrier layer adjacent to the conductor. The second barrier layer may or may not have the same composition as barrier 104C/104E.

Often encountered in this type of fabrication is a weak spot 107 where conductor 105E, barrier 104E, and cap 106 come together. Often there is a damage zone between the planarized materials 102, 104E, 105E and cap 106. Conductor atoms can slowly diffuse into the dielectric through this damage zone, eventually leading to time-dependent dielectric breakdown (TDDB).

Figure 2A:
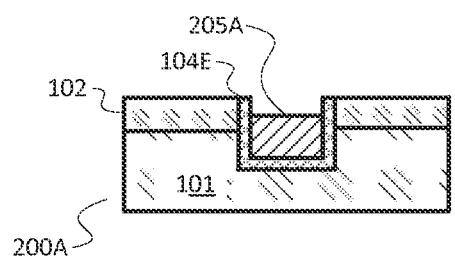
FIGS. 2A and 2B are conceptual cross-sections of alternative arrangements of the hard mask and barrier before adding the cap.
Figure 2B:
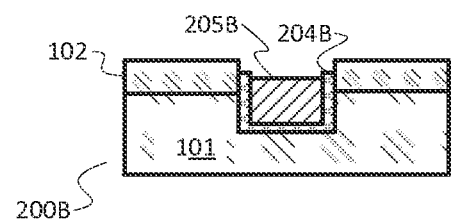

FIGS. 2A and 2B are conceptual cross-sections of alternative arrangements of the hard mask and barrier before adding the cap. In FIG. 2A, substrate 200A has the top surface of conductor 205A recessed from the original planarized surface (flush with barrier 104E and hard mask 102). When the cap is deposited, it will fill in the recess and atoms from the conductor will have to break through a better seal and travel a longer distance to reach dielectric 101 and eventually cause TDDB. Furthermore, many self-aligning via fabrication schemes, connecting one conductor layer or device layer with another, are more reliable if the conductor is recessed at this point. However, in a strong enough electric field, ions from the conductor may "wet" and "wick" up through at least some types of barrier 104E, which still reaches all the way to the damage zone of the planarized surface.

In FIG. 2B, this risk is mitigated by recessing barrier 204B, as well as conductor 205B, beneath the planarized surface. Ions from conductor 205B may wick into barrier 204B in a sufficiently strong electric field, but will not be able to reach the damage zone because barrier 204B no longer extends that far; thus TDDB is delayed or averted. In some embodiments, barrier 204B is not recessed quite as deeply as conductor 205B; in others, they may be recessed to the same depth. Different materials and intended applications may dictate different absolute and relative recess depths.

To recess the conductor without causing more, larger, or more severe weak spots in the planarization damage zone, a candidate etchant preferably does not etch the hard mask, or at least etches the hard mask much more slowly than it etches the conductor or barrier. This presents a challenge: Acids generally etch metals and metal nitrides rapidly, but also attack silicon oxides. Bases generally have less effect on silicon oxides, but they are also slower to etch metals and metal nitrides.

An aqueous solution of a base (e.g., APM or TMAH) with enough hydrofluoric acid to decrease the solution's pH to a range of about 8-10 etches copper and tantalum nitride without unacceptable damage to surrounding silicon dioxide or other dielectrics. In an APM solution, the hydrogen peroxide oxidizes the barrier materials and the hydrofluoric acid removes the oxides. Some refractory metals, such as tantalum, are relatively slow to etch with these solutions although their etch rate is boosted slightly by the addition of HF. Some possible concentration ratios are about

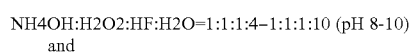

and

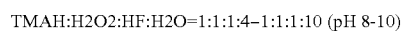

Treatment times range from about 1-5 minutes, and treatment temperatures range from about 40-60 C. Some formulations etch the conductor<10× as quickly as they etch the barrier. Some formulations etch the conductor between about 1.2 to about 3 times as fast as they etch the barrier. These differential etch rates facilitate recessing the metal conductor less than 10× as far as the metal-nitride conductor while leaving at least a portion of the hard mask in place.

Although the foregoing concepts have been described in some detail, some changes and modifications may be practiced within the scope of the appended claims. There are many alternative ways of implementing these processes and formulations. Accordingly, the described embodiments are illustrative and not restrictive.

What is claimed is:

1. A method of simultaneously etching a metal and a metal nitride, the method, comprising:
   exposing the metal and the metal nitride to a solution comprising hydrofluoric acid and a base;
   wherein the solution has a pH in a range of about 8 to about 10; and
   wherein the solution etches less than about 10 angstroms of silicon dioxide per second at a temperature of about 40° C.;

wherein the solution etches the metal nitride to a first recess level and etches the metal to a second recess level.

2. The method of claim 1, wherein the metal and the metal nitride are exposed to the solution for about 60 seconds at a temperature of about 40° C.

3. The method of claim 1, wherein the metal and the metal nitride are exposed to the solution for about 5 minutes at a temperature of about 60° C.

4. The method of claim 1, wherein the base comprises ammonia/hydrogen-peroxide mixture or tetramethylammonium hydroxide.

5. The method of claim 1, wherein proportions of ammonia, hydrogen peroxide, hydrofluoric acid, and water in the solution are about 1:1:1:10.

6. The method of claim 1, wherein the metal comprises copper, the metal nitride comprises tantalum nitride, and the solution etches the metal less than about 10 times as quickly as the solution etches the metal nitride.

7. A method of making a semiconductor device, the method comprising:
providing a substrate comprising a hard mask over a dielectric;
forming an opening through the hard mask into the dielectric;
lining the opening with a barrier;
filling the opening with a conductor;
removing the barrier, the conductor, and a portion of the hard mask from an area of the substrate outside the opening; and
simultaneously etching the barrier to a first recess level and etching the conductor to a second recess level;
wherein the etching comprises exposing the substrate to a solution comprising hydrofluoric acid and a base;
wherein the first recess level is lower than a top surface of the substrate; and
wherein the second recess level is lower than the first recess level.

8. The method of claim 7, wherein the conductive metal comprises copper and the barrier comprises a metal nitride.

9. The method of claim 8, wherein the conductive metal comprises copper and the barrier comprises tantalum nitride.

10. The method of claim 7, wherein the solution has a pH in a range of about 8 to about 10.

11. The method of claim 7, wherein the metal and the metal nitride are exposed to the solution for about 60 seconds at a temperature of about 40° C.

12. The method of claim 7, wherein the metal and the metal nitride are exposed to the solution for about 5 minutes at a temperature of about 60° C.

13. The method of claim 7, wherein the base comprises ammonia/hydrogen-peroxide mixture or tetramethylammonium hydroxide/hydrogen peroxide mixture.

14. The method of claim 7, wherein proportions of ammonia, hydrogen peroxide, hydrofluoric acid, and water in the solution are about 1:1:1:10.

15. The method of claim 8, wherein exposing the substrate to the solution leaves a portion of the hard mask in place.

16. The method of claim 8, wherein the second level is less than about 10 times further below the top surface of the substrate than the first level.

17. The method of claim 8, wherein the solution etches the conductor about 1.2 to about 3 times more quickly than the solution etches the barrier.

* * * * *